United States Patent
Tepman et al.

(10) Patent No.: US 6,440,261 B1
(45) Date of Patent: Aug. 27, 2002

(54) DUAL BUFFER CHAMBER CLUSTER TOOL FOR SEMICONDUCTOR WAFER PROCESSING

(75) Inventors: Avi Tepman, Cupertino; Donald J. K. Olgado, Palo Alto; Allen L. D'Ambra, Millbrae, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/318,233

(22) Filed: May 25, 1999

(51) Int. Cl.$^7$ ............................................... H01L 21/00
(52) U.S. Cl. .................. 156/345; 118/715; 204/298.25; 204/298.26; 204/298.35; 414/935; 414/937; 414/939
(58) Field of Search ................................ 118/715, 719, 118/723 R, 723 E; 414/935, 937, 939; 156/345; 204/298.25, 298.26, 298.35

(56) References Cited

U.S. PATENT DOCUMENTS

| | | | |
|---|---|---|---|
| 4,311,542 A | 1/1982 | Mueller et al. | 156/84 |
| 4,405,435 A | 9/1983 | Tateishi et al. | 204/298 |
| 4,498,416 A | 2/1985 | Bouchaib | 118/719 |
| 4,592,306 A | 6/1986 | Gallego | 118/719 |
| 4,607,593 A | 8/1986 | Van Hemel | 118/719 |
| 4,664,062 A | 5/1987 | Kamohara et al. | 118/719 |
| 4,680,061 A | 7/1987 | Lamont, Jr. | 148/1.5 |
| 4,681,773 A | 7/1987 | Bean | 427/38 |
| 4,687,542 A | 8/1987 | Davis et al. | 156/643 |
| 4,709,655 A | 12/1987 | Van Mastrigt | 118/719 |
| 4,715,921 A | 12/1987 | Maher et al. | 156/345 |
| 4,717,461 A | 1/1988 | Strahl et al. | 204/192.1 |
| 4,733,631 A | 3/1988 | Boyarsky et al. | 118/719 |

(List continued on next page.)

FOREIGN PATENT DOCUMENTS

| | | | |
|---|---|---|---|
| EP | 0 429 270 A2 | 5/1991 | G03F/7/36 |
| EP | 0756316 A1 | 1/1997 | |
| JP | 60-221572 | 6/1985 | |
| JP | 61-170568 | 8/1986 | |
| JP | 61-246381 | 11/1986 | |
| JP | 62-116769 | 5/1987 | |
| JP | 62-131455(2) | 6/1987 | |
| JP | 62-164875(2) | 7/1987 | |
| JP | 4-87782 A | 3/1992 | |
| JP | 4-87784 A | 3/1992 | |
| JP | 4-87785 A | 3/1992 | |
| WO | WO 87/07309 | 12/1987 | |
| WO | 99/13504 | 3/1999 | H01L/21/68 |

OTHER PUBLICATIONS

"Applications of Integrated Processing" Solid State Technology, US, Cowan Publ. Corp. Washington, vol. 37, No. 12, Dec. 1, 1994, pp. 45–47, 49.

Bader M. E. et al.: "Integrated Processing Equipment" Solid State Technology, US, Cowan Publ. Corp. Washington, vol. 33, No. 5, May 1, 1990, pp. 149–154.

Maydan, Dan "Cluster Tools for Fabrication of Advanced Devices" Japanese Journal of Applied Physics, Extended Abstracts 22nd Conf. Solid State Devices and Materials (1990).

Primary Examiner—Thi Dang
(74) Attorney, Agent, or Firm—Moser, Patterson & Sheridan LLP.

(57) ABSTRACT

Apparatus for multi-chambered semiconductor wafer processing comprising a polygonal structure having at least two semiconductor process chambers disposed on one side. An area between the process chambers provides a maintenance access to the semiconductor processing equipment. Additionally, the apparatus may be clustered or daisy-chained together to enable a wafer to access additional processing chambers without leaving the controlled environment of the semiconductor wafer processing equipment.

9 Claims, 12 Drawing Sheets

U.S. PATENT DOCUMENTS

| | | | |
|---|---|---|---|
| 4,739,787 A | | 4/1988 | Stoltenberg .................. 137/14 |
| 4,813,846 A | * | 3/1989 | Helms ..................... 414/744.1 |
| 4,816,098 A | | 3/1989 | Davis et al. ................. 156/345 |
| 4,820,106 A | | 4/1989 | Walde et al. ............... 414/217 |
| 4,825,808 A | | 5/1989 | Takahashi et al. .......... 118/719 |
| 4,857,160 A | | 8/1989 | Landau et al. ......... 204/192.12 |
| 4,886,592 A | | 12/1989 | Anderle et al. ............. 204/298 |
| 4,911,103 A | | 3/1990 | Davis et al. ................ 118/725 |
| 4,917,556 A | | 4/1990 | Stark et al. ................. 414/217 |
| 4,951,601 A | | 8/1990 | Maydan et al. ............. 118/719 |
| 4,966,519 A | | 10/1990 | Davis et al. ................ 414/786 |
| 5,000,113 A | | 3/1991 | Wang et al. ................ 118/723 |
| 5,044,871 A | | 9/1991 | Davis et al. ................ 414/786 |
| 5,067,218 A | | 11/1991 | Williams .................. 29/25.01 |
| 5,088,444 A | | 2/1992 | Ohmine et al. ............. 118/719 |
| 5,186,718 A | | 2/1993 | Tepman et al. ........... 29/25.01 |
| 5,199,483 A | | 4/1993 | Bahng ........................... 165/1 |
| 5,200,017 A | * | 4/1993 | Kawasaki et al. .......... 156/345 |
| 5,259,881 A | | 11/1993 | Edwards et al. ............ 118/719 |
| 5,286,296 A | | 2/1994 | Sato et al. .................. 118/719 |
| 5,352,248 A | | 10/1994 | Ishikawa et al. .......... 29/25.01 |
| 5,380,682 A | | 1/1995 | Edwards et al. ............ 437/225 |
| 5,445,484 A | | 8/1995 | Kato et al. .................. 414/217 |
| 5,516,732 A | | 5/1996 | Flegal ........................ 437/250 |
| 5,520,002 A | | 5/1996 | Ishikawa .................... 62/55.5 |
| 5,582,866 A | | 12/1996 | White ..................... 427/248.1 |
| 5,586,585 A | | 12/1996 | Bonora et al. ................. 141/93 |
| 5,609,689 A | | 3/1997 | Kato et al. ................... 118/719 |
| 5,667,592 A | * | 9/1997 | Boitnott et al. ............. 118/719 |
| 5,695,564 A | * | 12/1997 | Imahashi .................... 118/719 |
| 5,730,801 A | | 3/1998 | Tepman et al. ............. 118/719 |
| 5,769,952 A | | 6/1998 | Komino ...................... 118/733 |
| 5,784,238 A | | 7/1998 | Nering et al. .................. 361/65 |
| D397,346 S | | 8/1998 | Fan et al. ................ D15/144.1 |
| 5,788,447 A | | 8/1998 | Yonemitsu et al. ......... 414/217 |
| 5,795,355 A | | 8/1998 | Moran ....................... 29/25.01 |
| 5,833,426 A | | 11/1998 | Marohl ....................... 414/217 |
| 5,855,681 A | | 1/1999 | Mayden et al. ............. 118/719 |
| 5,882,165 A | | 3/1999 | Maydan et al. ............. 414/217 |
| 5,882,413 A | | 3/1999 | Beaulieu et al. ............ 118/719 |
| 5,902,088 A | | 5/1999 | Fairbairn et al. ........... 414/217 |
| 5,909,994 A | | 6/1999 | Blum et al. ................. 414/217 |
| 5,928,389 A | | 7/1999 | Jevtic ........................ 29/25.01 |
| 5,930,456 A | | 7/1999 | Vosen ......................... 392/416 |
| 5,944,857 A | | 8/1999 | Edwards et al. ........... 29/25.01 |
| 5,997,255 A | | 12/1999 | Krueger et al. ............... 417/48 |
| 6,017,820 A | | 1/2000 | Ting et al. .................. 438/689 |
| 6,039,770 A | | 3/2000 | Yang et al. ................ 29/25.01 |
| 6,042,623 A | | 3/2000 | Edwards .................... 29/25.01 |
| 6,044,534 A | | 4/2000 | Seo et al. ................... 29/28.01 |
| 6,048,154 A | | 4/2000 | Wytman ..................... 414/217 |
| 6,062,798 A | * | 5/2000 | Muka ......................... 414/416 |
| 6,145,673 A | | 11/2000 | Burrows et al. ......... 211/41.18 |

\* cited by examiner

DUAL BUFFER CHAMBER CLUSTER TOOL FOR SEMICONDUCTOR WAFER PROCESSING

BACKGROUND OF THE DISCLOSURE

1. Field of Invention

The present invention relates to a multiple chambered semiconductor wafer processing system and, more particularly, an apparatus containing two or more buffer chambers containing robots for transporting wafers to and from semiconductor wafer processing equipment.

2. Background of Prior Art

Semiconductor wafer processing is performed by subjecting a wafer to a plurality of sequential processes. These processes are performed in a plurality of process chambers. An assemblage of process chambers served by a wafer transport robot is known as a multi-chamber semiconductor wafer processing tool or cluster tool.

Previous cluster tools consisted of a single buffer chamber which housed a wafer transport robot that distributed wafers and managed a plurality of processing chambers. FIG. 1 depicts a schematic diagram illustrative of a multiple process chamber, single buffer chamber semiconductor wafer processing tool known as the Centura® Platform manufactured by Applied Materials, Inc. of Santa Clara, Calif. FIG. 2 depicts a schematic diagram illustrative of a multiple process chamber, single buffer chamber semiconductor wafer processing tool having a "daisy-chained" preparation chamber known as the Endura® Platform manufactured by Applied Materials, Inc. of Santa Clara, Calif. Both Centura® and Endura® are trademarks of Applied Materials, Inc. of Santa Clara, Calif. These tools can be adapted to utilize either single, dual or multiple blade robots to transfer wafers from chamber to chamber.

The cluster tool 100 depicted in FIG. 1 contains, for example, a plurality of process chambers, 104, 106, 108, 110, a buffer chamber 124, and a pair of load lock chambers 116 and 118. To effectuate transport of a wafer amongst the chambers, the buffer chamber 124 contains a robotic transport mechanism 102. The transport mechanism 102 shown has a pair of wafer transport blades 112 and 114 attached to the distal ends of a pair of extendible arms 113a, 113b, 115a and 115b, respectively. The blades 112 and 114 are used for carrying individual wafers to and from the process chambers. In operation, one of the wafer transport blades (e.g. blade 112) of the transport mechanism 102 retrieves a wafer 122 from a cassette 120 in one of the load lock chambers (e.g. 116) and carries that wafer to a first stage of processing, for example, physical vapor deposition (PVD) in chamber 104. If the chamber is occupied, the robot waits until the processing is complete and then swaps wafers, i.e., removes the processed wafer from the chamber with one blade (e.g., blade 114) and inserts a new wafer with a second blade (e.g., blade 112). Once the wafer is processed (i.e., PVD of material upon the wafer, the wafer can then be moved to a second stage of processing, and so on. For each move, the transport mechanism 102 generally has one blade carrying a wafer and one blade empty to execute a wafer swap. The transport mechanism 102 waits at each chamber until a swap can be accomplished.

Once processing is complete within the process chambers, the transport mechanism 102 moves the wafer 122 from the last process chamber and transports the wafer 122 to a cassette 120 within the load lock chamber 118.

The cluster tool 200 with daisy-chained wafer preparation chamber 204 depicted in FIG. 2 contains, for example, four process chambers 250, 252, 254, 256, a buffer chamber 258, a preclean chamber 210, a cooldown chamber 212, a prep chamber 204, a wafer-orienter/degas chamber 202, and a pair of load lock chambers 260 and 262. The prep chamber 204 is centrally located with respect to the load lock chambers 260 and 262, the wafer orienter/degas chamber 202, the preclean chamber 210, and the cooldown chamber 212. To effectuate wafer transfer amongst these chambers, the prep chamber 204 contains a prep robotic transfer mechanism 206, e.g., a single blade robot (SBR). The wafers 122 are typically carried from storage to the tool 200 in a cassette 120 that is placed within one of the load lock chambers 260 or 262. The SBR 206 transports the wafers 122, one at a time, from the cassette 120 to any of the three chambers 202, 210 or 212. Typically, a given wafer is first placed in the wafer orienter/degas chamber 202, then moved to the preclean chamber 210. The cooldown chamber 212 is generally not used until after the wafer is processed within the process chambers 250, 252, 254 and 256. Individual wafers are carried upon a prep wafer transport blade 208 that is located at a distal ends of a pair of extendible arms 264a and 264b of the SBR 206. The transport operation is controlled by a sequencer (not shown).

The buffer chamber 258 is surrounded by, and has access to, the four process chambers 250, 252, 254 and 256, as well as the preclean chamber 210 and the cooldown chamber 212. To effectuate transport of a wafer amongst the chambers, the buffer chamber 258 contains a second transport mechanism 214, e.g., a dual blade robot (DBR). The DBR 214 has a pair of wafer transport blades 112 and 114 attached to the distal ends of a pair of extendible arms 266a, 266b and 268a, 268b, respectively. In operation, one of the wafer transport blades (e.g., blade 114) of the DBR 214 retrieves a wafer 122 from the preclean chamber 210 and carries that wafer to a first stage of processing, for example, physical vapor deposition (PVD) in chamber 250. If the chamber is occupied, the robot waits until the processing is complete and then swaps wafers, i.e., removes the processed wafer from the chamber with one blade (e.g., blade 114) and inserts a new wafer with a second blade (e.g., blade 112). Once the wafer is processed (i.e., PVD of material upon the wafer), the wafer can then be moved to a second stage of processing, and so on. For each move, the DBR 214 generally has one blade carrying a wafer and one blade empty to execute a wafer swap. The DBR 214 waits at each chamber until a swap can be accomplished.

Once processing is complete within the process chambers, the transport mechanism 214 moves the wafer from the process chamber and transports the wafer 122 to the cooldown chamber 212. The wafer is then removed from the cooldown chamber using the prep transport mechanism 206 within the prep chamber 204. Lastly, the wafer is placed in the cassette 120 within one of the load lock chambers, 260 or 262.

Although the prior art has shown itself to be a dependable tool for processing semiconductor wafers, a number of design shortcomings are apparent. One example is the limited number of process chambers which can be serviced by the wafer transfer mechanism. Although the size of the buffer chamber can be increased to house a mechanism with a greater range of motion thus allowing for an increase in the number of processing chambers, this solution is not favored since the foot-print (or consumed floor space) of the cluster tool would become prohibitively large. A minimal tool foot-print is an important design criteria.

A second example of the shortcomings in the prior art is the lack of serviceability of the buffer chamber. As depicted in both FIGS. 1 and 2, the buffer chamber is surrounded by processing chambers and other chambers. When either the wafer transfer mechanism or other components located within the buffer chamber requires service, access is extremely limited. As such, the removal of one of the surrounding chambers is required to gain access to the buffer chamber. This causes an extended period of time to be expended for service, while increasing the probability of component wear and damage due to the removal and handling of the above mentioned components.

Another example of the shortcomings in the prior art is the inability to cluster buffer chambers for use in serial wafer processing. Serial processing often requires more processing chambers than are available on a cluster tools found in the prior art. When additional processing is required, the wafer must be removed, transported and inserted from one cluster tool to a second cluster tool. This interruption and removal of the wafer from a tool's controlled environment results in additional time required to complete wafer processing and an increase in the probability of damage or contamination of the wafer.

As illustrated above, a need exists in the art for a multiple process chamber semiconductor wafer processing tool which allows for an increased number of processing chambers while minimizing tool foot-print, increasing wafer processing throughput, and consolidating peripheral components while allowing access for service and maintenance.

SUMMARY OF INVENTION

The disadvantages heretofore associated with the prior art are overcome by an invention of a method and apparatus for transporting wafers to and from wafer processing chambers utilizing a dual buffer chamber within a multiple process chamber semiconductor wafer processing system or cluster tool. The invention provides for additional number of processing chambers in the cluster tool without compromising system foot-print. The invention also provides increased throughput, accessibility to the buffer chamber and the ability to cluster buffer chambers to facilitate serial wafer processing.

One embodiment of the invention contains at least one polygonal structure having a plurality of sides and at least one of said sides having at least two process chambers disposed thereupon. The process chambers define an access area to said polygonal structure. Further, the polygonal structure has a first buffer chamber, a second buffer chamber and at least one wafer transfer location disposed within said polygonal structure. The first and second buffer chambers further have a first and a second lid disposed thereabove, respectively, thereby defining single environment within said first and second buffer chambers. Additionally, the first and second buffer chambers may contain a plurality of slit valves disposed about and selectively isolating said first and second buffer chamber, thereby defining a first and second environment within said first and second buffer chambers, respectively.

A second embodiment of the invention comprises a first polygonal module having a plurality of sides, at least a second polygonal module having a plurality of sides, and at least one mating chamber for connecting said first and said at least second polygonal modules. The first and at least second polygonal modules each further comprise a first and a second process chamber disposed on at least one of their sides that define an access area. Additionally, the apparatus contains at least one wafer transfer location and at least one buffer chamber disposed within said first polygonal module and preferably a first buffer chamber and a second buffer chamber. Said first and second buffer chambers further comprise a plurality of slit valves creating a first and a second environment within said first and said second buffer chamber, respectfully. The advantage of this configuration utilizing multiple buffer chambers is that the wafer may be transported from one modular buffer chamber to a second modular dual buffer chamber without the wafer leaving the controlled environment created within the cluster tool. This allows for expedited serial processing of wafers while minimizing wafer damage and contamination. Specifically, two or more modular buffer chambers may be daisy chained together through the use of a mating chamber to form the modular dual buffer chamber.

In a third embodiment of the invention, a semiconductor workpiece processing apparatus comprises at least one polygonal structure having a plurality of sides; a buffer chamber disposed within said at least one polygonal structure; a lid disposed above said at least one polygonal structure thereby defining a single environment within said buffer chamber; and at least two wafer transfer mechanisms disposed within said buffer chamber. The lack of a center wall allows for a reduction in tool's foot-print. If the demands on foot-print size outweigh the need for ease of access to the buffer chamber, the access area may be reduced or eliminated to further minimize the foot-print area. This embodiment allows for faster wafer processing and greater throughput since the time required to open and close slit valves, and match environments is eliminated. The apparatus further comprises at least six slit valves disposed within said buffer chamber and a first and second process chamber disposed on one of said sides defining an access area between said first and second process chamber and said one side.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Although the subject invention contains various embodiments have differentiating features which make a particular embodiment more desirable to a particular user, all the embodiments share the important attributes of increased mounting facets for additional processing chambers, smaller foot-prints of systems with a comparable number of processing chambers, shared peripheral components (pumps, controllers, power supplies and the like), access to buffer chambers, and increased wafer processing throughput. One important feature of the subject invention is accessibility of the central, or buffer chamber, from a number of access areas located between designated process chamber. More importantly, the improved serviceability of the tool was achieved while reducing the tool's overall foot-print. Additionally, the tool features more than one wafer transport mechanism servicing the process chambers, and more specifically, the division of wafer transfer responsibility in that a particular robot serves a designated group of process chambers. This feature allows for the additional number of process chambers to be utilized, increasing wafer throughput without quality degradation. Other features and benefits will be apparent upon review of the details of the specific embodiments disclosed below.

Dual Buffer Chamber Cluster Tool

Figure 1:
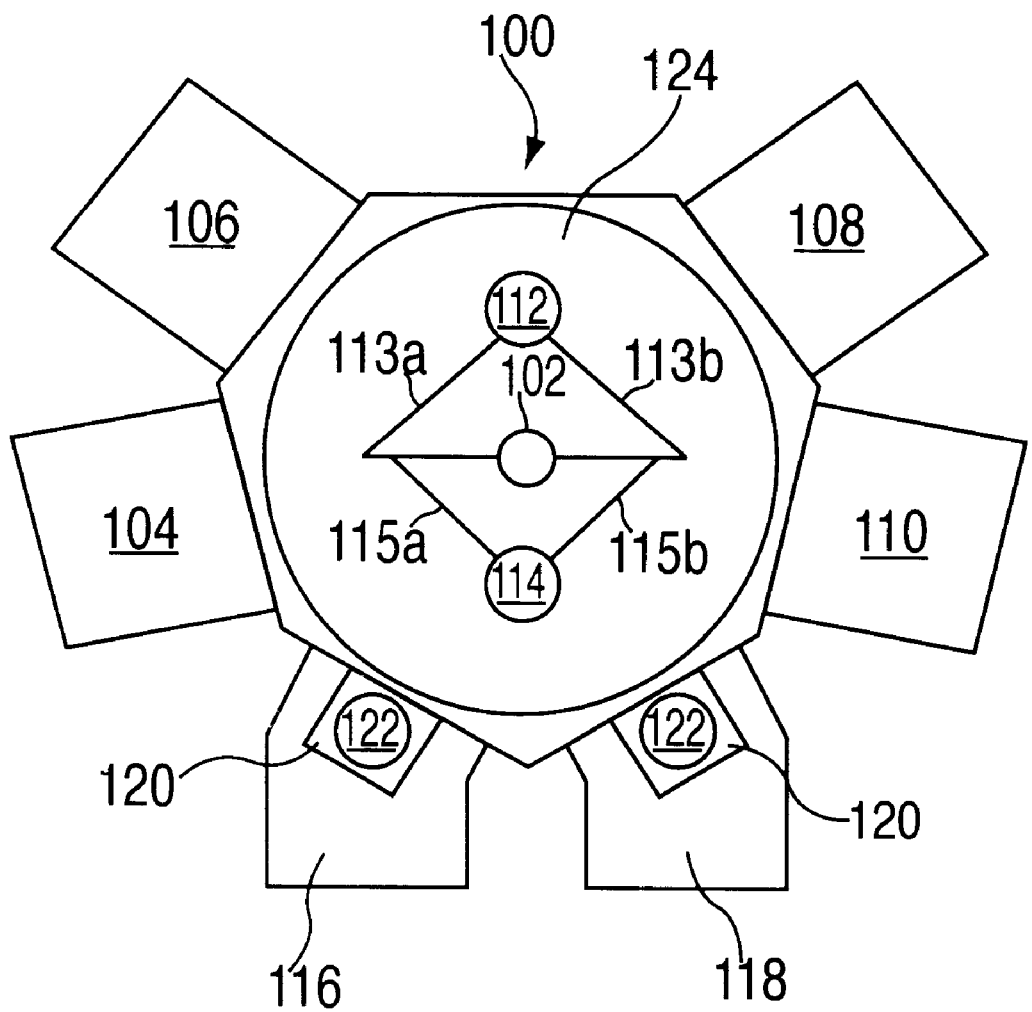
FIG. 1 depicts a detailed schematic diagram of a prior art single buffer chamber, multiple process chamber semiconductor wafer processing tool.
Figure 2:
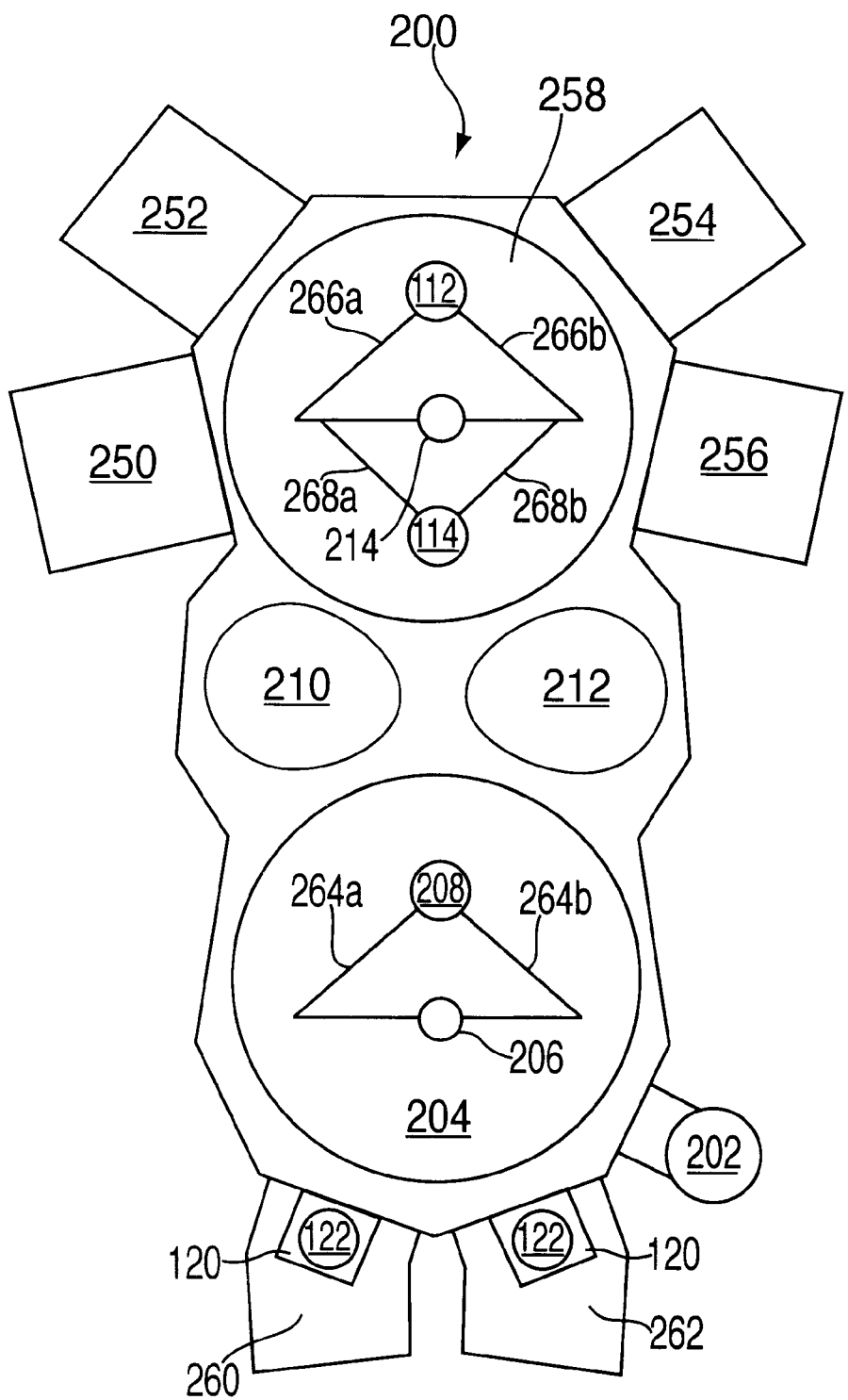
FIG. 2 depicts a detailed schematic diagram of a prior art single buffer chamber, multiple process chamber semiconductor wafer processing tool chamber with daisy-chained preparation chamber.
Figure 3:
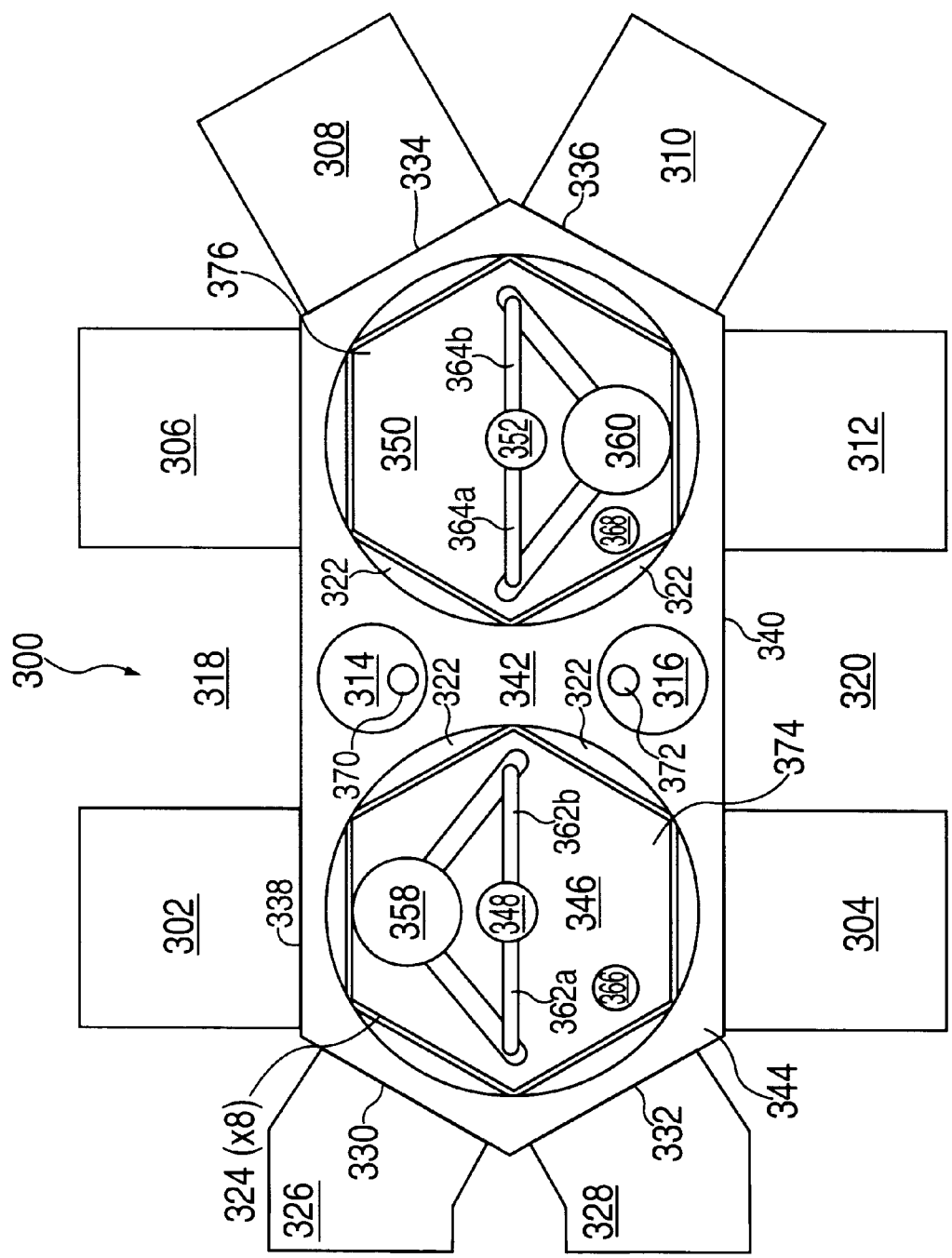
FIG. 3 depicts a simplified schematic diagram of a dual buffer chamber, multiple process chamber semiconductor wafer processing tool in accordance with the present invention.
Figure 4:
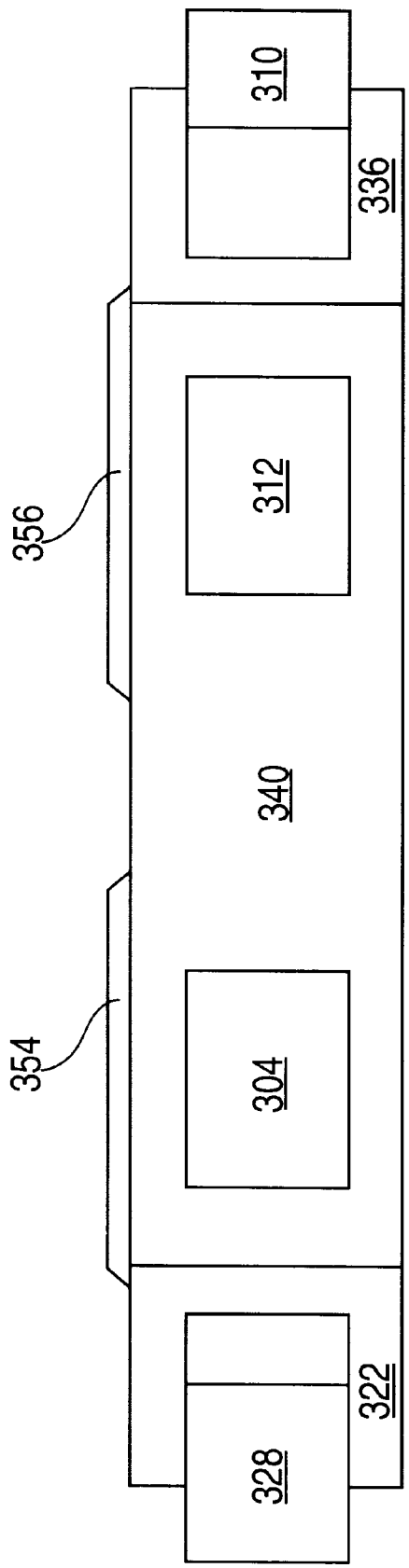
FIG. 4 depicts an elevation view of FIG. 3.

The first embodiment of the invention, a dual buffer chamber, multiple process chamber semiconductor processing tool or dual buffer chamber cluster tool, is depicted in FIG. 3 and FIG. 4. As such, the reader should refer to FIGS. 3 and 4 simultaneously for the best understanding of the invention. The tool 300 has a first buffer chamber and a second buffer chamber, 346 and 350, respectively, and a first wafer transfer location and a second wafer transfer location, 314 and 316, respectively, disposed within a hexagonal structure 344. The wafer transfer locations may be a chamber. The hexagonal structure 344 has four sides of equal length 330, 332, 334 and 336, and two longer sides of equal length 338 and 340. Side 334 is bordered by sides 338 and 336. Side 338 is bordered by 330 and is parallel to side 340. Side 340 is bordered by sides 332 and 336. Sides 332 and 330 border each other. A first and second load lock chamber 326 and 328, respectively, are disposed on the sides 330 and 332. A pair of process chambers 302 and 306 are disposed on side 338. A second pair of process chambers 304 and 312 are disposed on side 340. Process chambers 308 and 310 are disposed on sides 334 and 336, respectively. The process chambers are orientated perpendicularly in with respect to their respective walls.

All process and load lock chambers 212 are selectively isolated from the buffer chambers 346 and 350 by plurality of slit valves 324 (i.e., eight) creating a first and second environment, 374 and 376, respectively. The use of slit valves to isolate a process chamber from other chambers is known in the art and is described in U.S. Pat. No. 5,730,801 by Avi Tepman et al, and is hereby incorporated by reference.

The hexagonal structure 344 has a central wall 342 which runs perpendicular to the sides 338 and 340. The central wall 342 separates the buffer chambers 346 and 350. The wafer transfer locations 314 and 316 provide individual passage though the central wall 342 to the buffer chambers 346 and 350. The wafer transfer locations 314 and 316 are selectively isolated from adjoining buffer chambers 346 and 350 by a plurality (i.e., four) of slit valves 322. Specifically, one slit valve is provided between first buffer chamber 346 and the first transfer chamber 314, one additional slit valve is provided between first transfer chamber 314 and second buffer chamber 350, one slit valve is provided between first buffer chamber 346 and second transfer chamber 316 and one slit valve is provided between second buffer chamber 350 and second transfer chamber 316. The use of the slit valves allows for the pressure in each chamber to be individually controlled. Each wafer transfer location 314 and 316 additionally has a wafer pedestal 370 and 372, respectively, for supporting the wafer in the chamber.

The first buffer chamber 346 is circumscribed by the load lock chambers 326 and 328, process chambers 302 and 304, and wafer transfer locations 314 and 316. Each of the process chambers 302 and 304, and the load lock chambers 326 and 328 are selectively isolated from the buffer chamber 346 by slit valve 324. Located within buffer chamber 346 is a first vacuum port 366 and a first robotic wafer transport mechanism 348, e.g., a single blade robot (SBR). Other types of transport mechanisms may be substituted. The first robotic wafer transport mechanism 348 shown has a wafer transport blade 358 attached to the distal ends of a pair of extendible arms, 362a and 362b. The blade 358 is used by first robotic wafer transport mechanism 348 for carrying the individual wafers to and from the chambers circumscribing the first buffer chamber 346.

The second buffer chamber 350 is circumscribed by the process chambers 306, 308, 310 and 312, and wafer transfer locations 314 and 316. Located within buffer chamber 350 is a second vacuum port 368 and a second robotic wafer transport mechanism 352, e.g., a single blade robot (SBR). Other types of transport mechanisms may be substituted. The second robotic wafer transport mechanism 352 shown has a wafer transport blade 360 attached to the distal ends of a pair of extendible arms 364a and 364b. The blade 360 is used by second robotic wafer transport mechanism 352 for carrying the individual wafers to and from the chambers circumscribing the second buffer chamber 350.

Both buffer chambers 346 and 350 have an independently operable lid 354 and 356 (see FIG. 4) attached to the hexagonal structure 344 that allows access to the chambers 346 and 350. First and second access areas 318 and 320, respectively, are defined by the process chambers 302, 306, 304 and 312, and the intersection of the central wall 342 and the sides 338 and 340 respectively.

The vacuum ports 366 and 368 are connected to a pumping mechanism (not shown) such as a turbo molecular pump, which is capable of evacuating the environments of chambers 346 Fand 350, respectively. The configuration and location of the vacuum ports may vary dependent on design criteria for individual systems, for example the use of a single port in conjunction with a high volume pump.

In operation, the slit valves 322 and 324 isolating the buffer chamber 346 from the surrounding chambers, remain closed unless wafer transfer requires access to a particular chamber. The slit valves 322 and 324 isolating buffer chamber 350 operate similarly. Wafer processing, for example, begins with the buffer chambers 346 and 350 being pumped down to a vacuum condition by the pumping mechanism. The first robotic wafer transport mechanism 348 retrieves a wafer from one of the load lock chambers (e.g. 326) and carries that wafer to the first stage of processing, for example, physical vapor deposition (PVD) in chamber 302. Once the first robotic wafer transport mechanism 348 is no longer is carrying a wafer, first robotic wafer transport mechanism 348 can tend wafers in the other chambers surrounding buffer chamber 346. Once the wafer is processed and PVD stage deposits material upon the wafer, the wafer can then be moved to a second stage of processing, and so on.

If the required processing chamber is located adjacent to second buffer chamber 350, then the wafer must be transported into one of the wafer transfer locations (e.g. 314). The slit valve 322 separating buffer chamber 346 and wafer transfer location 314 is opened. The first robotic wafer transport mechanism 348 transports the wafer into the wafer transfer location 314. The wafer transport blade 358 connected to first robotic wafer transport mechanism 348 is removed from wafer transfer location 314 leaving the wafer on the pedestal 370. After the slit valve separating the buffer chamber 346 and the transfer chamber 314 is closed, a second slit valve separating the buffer chamber 350 and the transfer chamber 314 is opened, allowing the wafer transport blade 360 connected to the second robotic wafer transport mechanism 352 to be inserted into wafer transfer location 314 to retrieve the wafer. Once the wafer is inside buffer chamber 350, the second slit valve is closed and the second robotic wafer transport mechanism 352 is free to move the wafer to the desired processing chamber or sequence of chambers serviced by buffer chamber 350 and second robotic wafer transport mechanism 352.

After wafer processing is complete, the wafer is loaded into a cassette (not shown)in a load lock (e.g. 328), moving the wafer back through the wafer transfer location when necessary.

After a number of complete processing cycles, the buffer chambers 346 and 350 may require service. Maintenance personnel can service the buffer chambers 346 and 350 at either access area 318 or 320. Access to the buffer chambers 346 and 350 may also be achieved by opening or removing the lids 354 and 356.

Clustered Dual Buffer Chamber Tool

Figure 5:
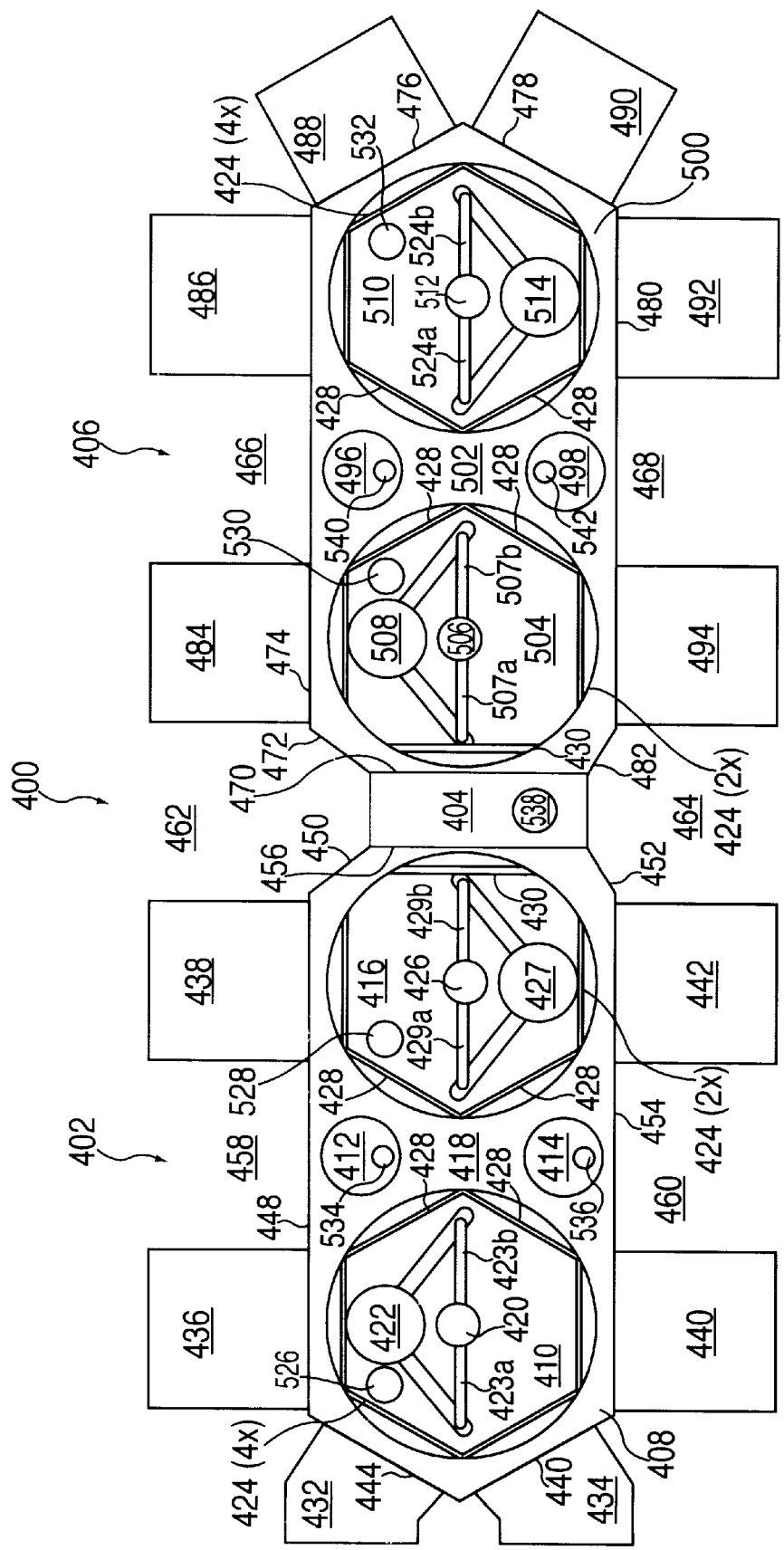
FIG. 5 depicts a simplified schematic diagram of a second embodiment of the invention of two dual buffer chamber, multiple process chamber semiconductor wafer processing tools clustered together.
Figure 6:
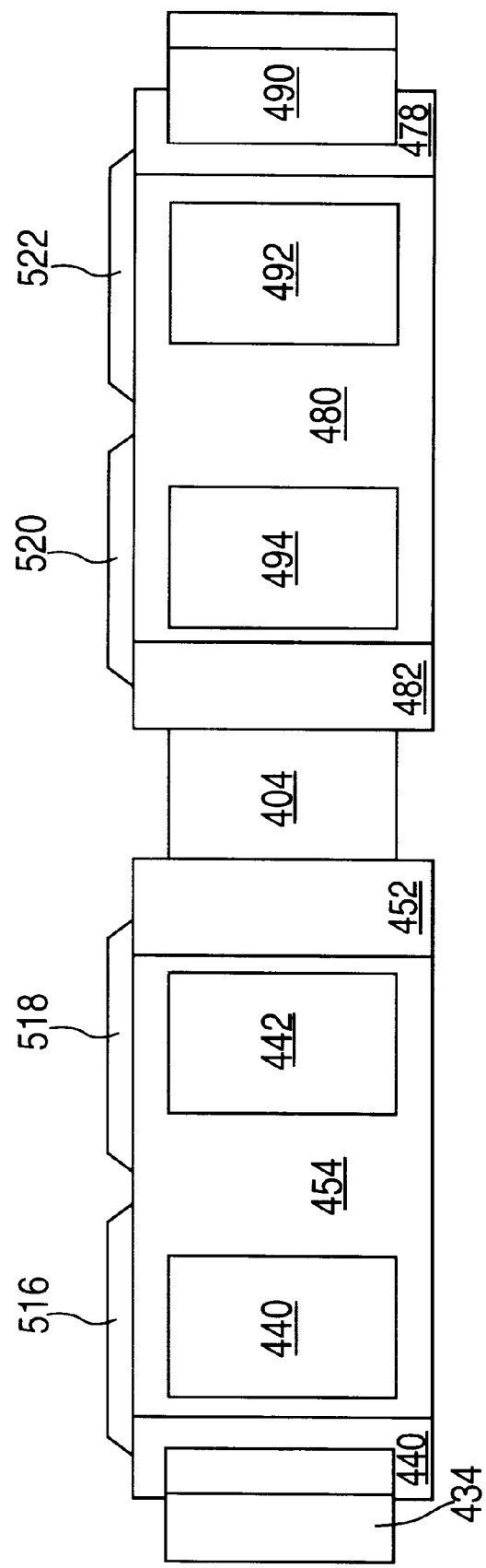
FIG. 6 depicts an elevation view of FIG. 5.

An alternate embodiment of the invention is the clustering of two or more dual buffer chamber cluster tools, creating a multiple buffer chamber, multiple process chamber semiconductor processing tool or clustered dual buffer chamber. This embodiment is depicted in FIGS. 5 and 6. As such, the reader is encouraged to refer to FIGS. 5 and 6 simultaneously for the best understanding of the invention.

The clustered tool 400 as shown in FIG. 5, has two dual buffer chambers 402 and 406, connect by a cluster mating chamber 404. Dual buffer chamber 402 has a septigonal structure 408 which features sides 450 and 452 having an equal length, sides 444 and 446 having an equal length longer than the length of side 450, sides 448 and 454 having an equal length longer than side 444, and a seventh shortest side 456. Sides 448 and 454 are parallel to each other. Side 448 is bounded by side 450 and 444. Side 450 is also bounded by side 456. Side 456 is also bounded by side 452. Side 452 is also bounded by side 454. Side 454 is also bounded by side 446. Side 446 is also bounded by side 444. Two load lock chambers 432 and 434 are disposed on sides 444 and 446 respectively. A cluster mating chamber 404 is disposed on side 456. A pair of process chambers 436 and 438 are disposed on side 448. An access area 458 is defined by and separates chambers 436 and 438. A second pair of process chambers 440 and 442 are disposed on side 454. An access area 460 is defined by and separates process chambers 440 and 442. The access areas 458 and 460 are large enough to provide maintenance access to dual buffer chamber 402.

Disposed within the septigonal structure 408 are buffer chambers 410 and 416, and wafer transfer locations 412 and 414. The wafer transfer locations may be chambers. A central wall 418 runs perpendicular to sides 448 and 454 and separates buffer chambers 410 and 416. Wafer transfer locations 412 and 414 provide a passage through the central wall 418, with each transfer chamber 412 and 414 individually connecting buffer chambers 410 and 416. The wafer transfer locations 412 and 414 are selectively isolated from adjoining buffer chamber 410 and 416 by a plurality (i.e., four) slit valves 428. Each wafer transfer location 412 and 414, and the cluster mating chamber 404 has a pedestal 534, 536, and 538, respectively. Both buffer chambers 410 and 416 have an independently operable lid 516 and 518 respectively (see FIG. 6) attached to septigonal structure 408 that allows access to said buffer chambers 410 and 416.

The buffer chamber 410 is circumscribed by the load lock chambers 432 and 434, process chambers 436 and 440, and wafer transfer locations 412 and 414. The load lock chambers 432 and 434, and process chambers 436 and 440 are selectively isolated from adjoining buffer chamber 410 by a plurality (i.e., four) of slit valves 424. Located within buffer chamber 410 is first vacuum port 526 and a first robotic wafer transport mechanism 420, e.g., a single blade robot (SBR). Other types of transfer mechanisms may be substituted. The first robotic wafer transport mechanism 420 shown has a wafer transport blade 422 attached to the distal ends of a pair of extendible arms 423a and 423b. The blade 422 is used by first robotic wafer transport mechanism 420 for carrying the individual wafers to and from the chambers surrounding buffer chamber 410.

The second buffer chamber 416 is circumscribed by the process chambers 438 and 442, the cluster mating chamber 404, and wafer transfer locations 412 and 414. Each of the process chambers 438 and 442 are selectively isolated from adjoining buffer chamber 416 by a plurality (i.e., two) slit valves 424. The cluster mating chamber 404 is selectively isolated from the adjoining buffer chamber 416 by slit valve 430. Located within buffer chamber 416 is a second vacuum port 528 and a second robotic wafer transport mechanism 426, e.g., a single blade robot (SBR). The second robotic wafer transport mechanism 426 shown has a wafer transport blade 427 attached to the distal ends of a pair of extendible arms 429a and 429b. The blade 427 is used by second robotic wafer transport mechanism 426 for carrying the individual wafers to and from the chambers surrounding buffer chamber 416.

Dual buffer chamber 406 has a septigonal structure 500 which features sides 474 and 480 having an equal length, sides 476 and 478 having an equal length shorter than 474, sides 472 and 482 having an equal length shorter than 476, and a seventh shortest side 470. Sides 474 and 480 are parallel. Side 476 is bounded by 478 on one side and side 474 on the other. Side 478 is also bounded by side 480. Side 480 also bounded by side 482. Side 482 is also bounded by side 470. Side 470 is also bounded by side 472. Mating chamber 404 is disposed on side 470. Two process chambers 488 and 490 are disposed on sides 476 and 478 respectively. A pair of process chambers 484 and 486 are disposed on side 474. An access area 466 is defined by and separates chamber process chambers 484 and 486. A second pair of process chambers 492 and 494 are disposed on side 480. An access area 468 is defined by and separates chamber process chambers 492 and 494. The access areas 466 and 468 are large enough to provide maintenance access to dual buffer chamber 406.

Disposed within the septigonal structure 500 are buffer chambers 504 and 510, and wafer transfer locations 496 and 498. A central wall 502 runs perpendicular to sides 474 and 480 and separate buffer chambers 504 and 510. Wafer transfer locations 496 and 498 provide a passage through the central wall 502, with each transfer chamber 496 and 498 individually connecting buffer chambers 504 and 510. The wafer transfer locations 496 and 498 are selectively isolated from adjoining buffer chamber 504 and 510 by a plurality (i.e., four) slit valves 428. Each wafer transfer location 496 and 498 additionally has a pedestal 540 and 542, respectively. Both buffer chambers 504 and 510 having an independently operable lid 520 and 522 respectively (FIG. 6) attached to septigonal structure 500 that allows for access to chamber 504 and 510.

The buffer chamber 504 is circumscribed by the cluster mating chamber 404, process chambers 484 and 494, and wafer transfer locations 496 and 498. Each of the process chambers 484 and 494 are selectively isolated from adjoining buffer chamber 504 by a plurality (i.e., two) slit valve 424. The cluster mating chamber 404 is selectively isolated from the buffer chamber 504 by a slit valve 430. Located within buffer chamber 504 is a third vacuum port 530 and a third robotic wafer transport mechanism 506, e.g., a single blade robot (SBR). Other types of transfer mechanisms may be substituted. The third robotic wafer transport mechanism 506 shown has a wafer transport blade 508 attached to the distal ends of a pair of extendible arms 507a and 507b. The blade 508 is used by third robotic wafer transport mechanism 506 for carrying the individual wafers to and from the chambers surrounding buffer chamber 504.

The second buffer chamber 510 is circumscribed by the process chambers 486, 488, 490 and 492, and wafer transfer locations 496 and 498. Each process chamber 486, 488, 490 and 492 is selectively isolated from buffer chamber 510 by a plurality (i.e., four) slit valves 424. Located within buffer chamber 510 is a fourth vacuum port 532 and a fourth robotic wafer transport mechanism 512, e.g., a single blade robot (SBR). The fourth robotic wafer transport mechanism 512 shown has a wafer transport blade 514 attached to the distal ends of a pair of extendible arms 524a and 524b. The blade 514 is used by fourth robotic wafer transport mechanism 512 for carrying the individual wafers to and from the chambers surrounding buffer chamber 510.

Although the configuration of dual buffer chambers 402 and 406 illustrate the cluster mating chamber 404 positioned as to create a linear relation between the respective buffer chambers, this is illustrative only. The number of dual buffer chambers, process chambers per buffer chamber, geometry of the buffers and the location of the cluster mating chamber is dependent on a number of parameters unique to each user's needs, including but not limited to desired wafer throughput, available factory floor space, production line layouts and capital constraints. Many other configurations which embody the teachings of the invention will be readily apparent to those skilled in the arts.

The vacuum ports 526, 528, 530, and 532 are connected to a pumping mechanism (not shown) such as a turbo molecular pump, which is capable of evacuating the environments of chambers 410, 416, 504 and 510, respectively. The configuration and location of the vacuum ports may vary dependent on design criteria for individual systems, for example the use of a single port in conjunction with a high volume pump.

In operation, the slit valves 424 and 428 isolating the buffer chamber 410 from the surrounding chambers remain closed unless wafer transfer requires access to a particular chamber. The slit valves 424, 428 and 430 isolating buffer chambers 416, 504 and 510 operate similarly. Wafer processing, for example, begins when the chambers 410, 416, 504, and 510 are pumped down to a vacuum condition by the pumping mechanism. The first wafer transfer robot 420 retrieves a wafer from one of the load lock chambers (e.g. 432) and carries that wafer to the first stage of processing, for example, a physical vapor deposition (PVD) in chamber 436. If the chamber is occupied, the first robotic wafer transport mechanism 420 can either wait for the chamber 436 to become available or move the wafer to a pedestal 534 located within wafer transfer location (e.g. 412). Once the first robotic wafer transport mechanism 420 no longer is carrying a wafer, first robotic wafer transport mechanism 420 can tend wafers in the other chambers surrounding buffer chamber 410. If chamber 436 is available, the first robotic wafer transport mechanism 420 deposits the wafer in chamber 436. Once the wafer is processed and PVD stage deposits material upon the wafer, the wafer can then be moved to a second stage of processing, and so on.

If the required processing chamber is located adjacent to buffer chamber 416, 504 or 510, then the wafer must be transported into one of the wafer transfer locations (e.g., 412). The slit valve 428 isolating the wafer transfer location 412 from the buffer chamber 410 opens, allowing the wafer to be inserted into the wafer transfer location 412. The wafer transport blade 422 connected to first robotic wafer transport mechanism 420 is removed from wafer transport chamber 412 leaving the wafer on the pedestal 534. After the slit valve 428 separating the buffer chamber 410 and the transport chamber 412 is closed, a second slit valve 428 separating the buffer chamber 416 and the transport chamber 412 is opened, allowing a wafer transport blade 427 connected to the second robotic wafer transport mechanism 426 to be inserted into wafer transport chamber 412 to retrieve the wafer. Once the wafer is inside buffer chamber 416, the second slit valve 428 is closed and the second robotic wafer transport mechanism 426 is free to move the wafer to the desired processing chamber or sequence of chambers serviced by buffer chamber 416 and second robotic wafer transport mechanism 426.

If the processing chamber is not serviced by buffer chamber 416, the wafer is then transported by second robotic wafer transport mechanism 426 to the cluster mating chamber 404 and deposited on a pedestal 538. After the slit valve 430 separating the buffer chamber 416 and the cluster mating chamber 404 is closed, a second slit valve 430 separating the buffer chamber 504 and the cluster mating chamber 404 is opened, allowing a wafer transport blade 508 connected to the third robotic wafer transport mechanism 506 to be inserted into the cluster mating chamber 404 to retrieve the wafer. Once the wafer is inside buffer chamber 504, the second slit valve 430 is closed and the third robotic wafer transport mechanism 506 is free to move the wafer to the desired processing chamber or sequence of chambers serviced by buffer chamber 504 and third robotic wafer transport mechanism 506.

If the processing chamber is not located within buffer chamber 504, the wafer is then transported by third robotic wafer transport mechanism 506 into one of the wafer transfer location (e.g., 496). The wafer transport blade 508 connected to third robotic wafer transport mechanism 506 is removed from wafer transport chamber 496 leaving the wafer on the pedestal 540. After the third slit valve 428 separating the buffer chamber 504 and the transport chamber 496 is closed, a fourth slit valve 428 separating the buffer chamber 510 and the transport chamber 496 is opened, allowing a wafer transport blade 514 connected to the fourth robotic wafer transport mechanism 512 to be inserted into wafer transport chamber 496 to retrieve the wafer. Once the wafer is inside buffer chamber 510, the second slit valve 428 is closed and the fourth robotic wafer transport mechanism 512 is free to move the wafer to the desired processing chamber or sequence of chambers serviced by buffer chamber 510 and fourth robotic wafer transport mechanism 512.

After wafer processing is complete, the wafer is loaded into a cassette (not shown) in a load lock (e.g., 434), moving back through the wafer transfer and cluster mating chambers when necessary. Although the example is illustrative of wafer movement towards the right in FIG. 5, wafer processing requirements in buffer chambers to the left of wafer location may require movement to the left during over the course of wafer processing. This may be accomplished by reversing the order of the steps required to transfer the wafer through any of the transfer or cluster mating chambers as needed. Additionally, the sequencing of the slit valves between the buffer chambers 410, 416, 504, and 510, transfer chambers 412, 414, 496 and 498 and the cluster mating chamber 404 is for example only. Some slit valves remain open dependant upon desired vacuum condition in the adjoining chamber or to reduce wafer transfer time as necessary.

After a number of complete processing cycles, the chambers 410, 416, 504 and 510 may require service. Maintenance personnel can reach the chambers 410, 416, 504 and 510 at access areas 458, 460, 466 and 468, and gain access to the interior of said chambers by opening or removing the lids 516, 518, 520 and 522.

As set forth by this embodiment, serial processing of wafers is facilitated by allowing a large number of process chambers to be clustered within one tool. This yields the important benefits of maintaining the wafer within a controlled environment, saving time and preventing costly damage and contamination to the wafer, minimizing tool footprint, increasing wafer throughput by having more process chambers available within a tool and having more robots available for the increased demands of wafer transfer, and allowing the tool to share peripheral components which assist in keeping capital costs at a minimum.

Modular Dual Buffer Chamber

Figure 7:
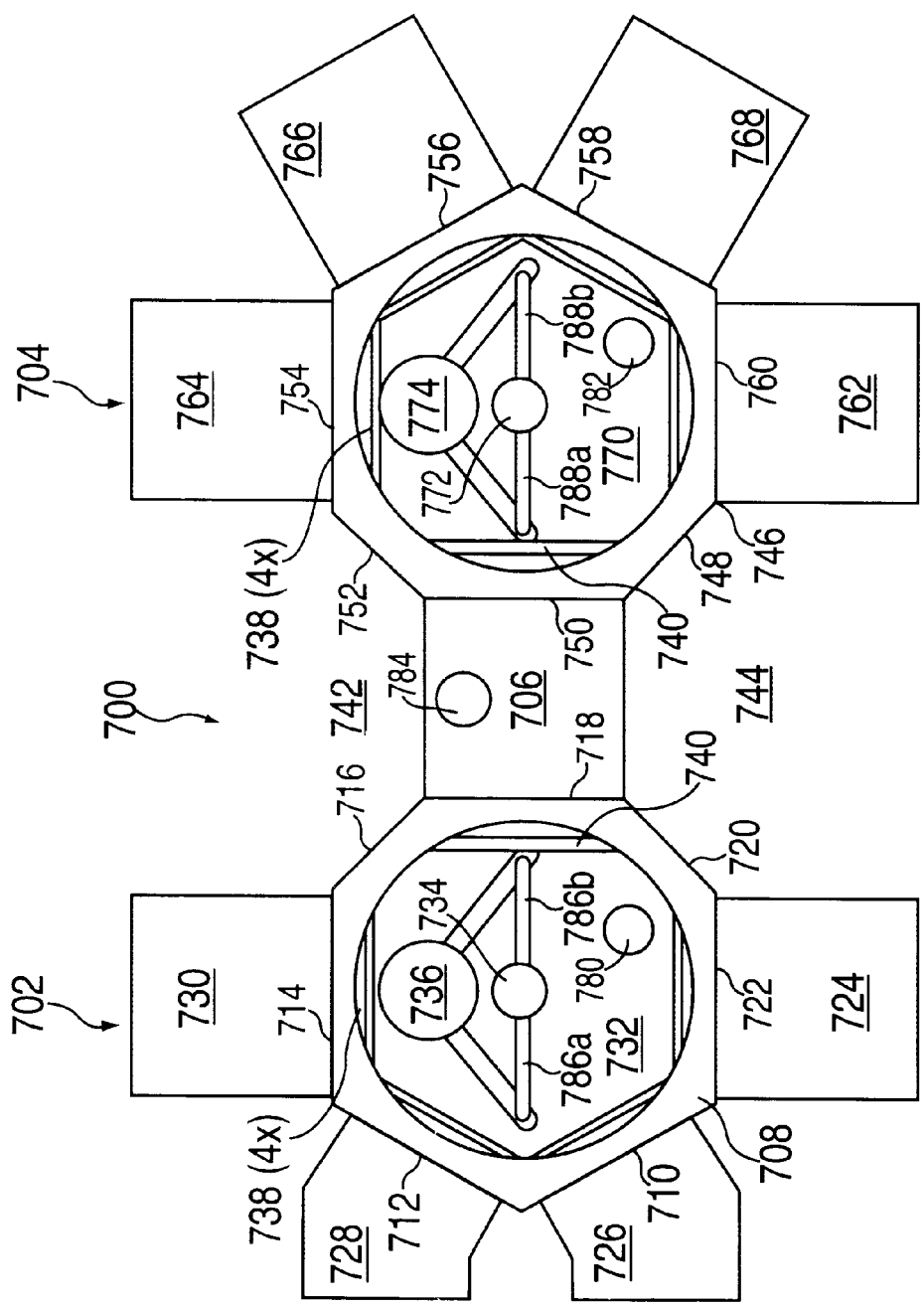
FIG. 7 depicts a simplified schematic diagram of a third embodiment of the invention of a modular dual buffer chamber, multiple process chamber semiconductor wafer processing tool fabricated by joining two modular buffer chambers.
Figure 8:
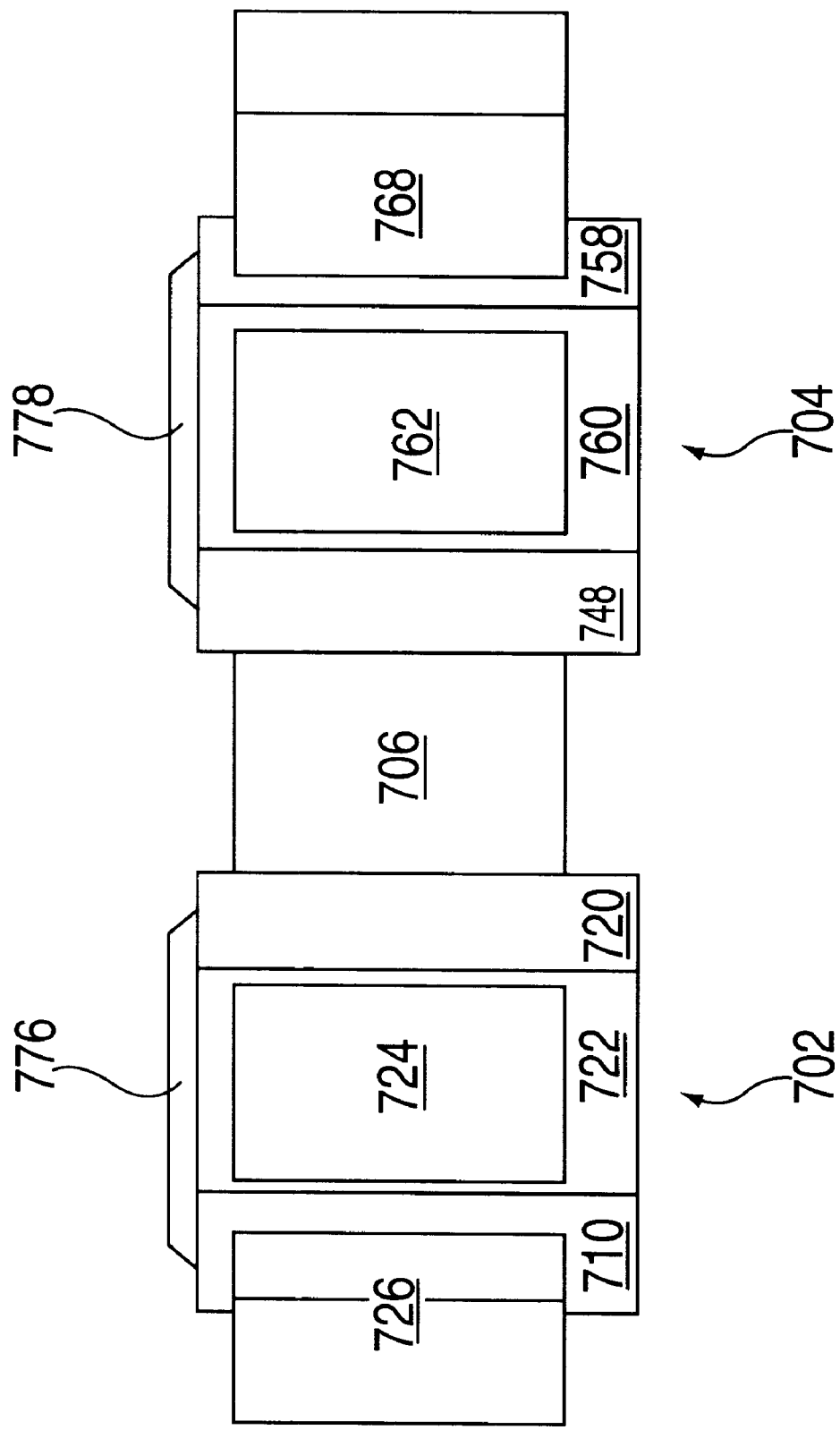
FIG. 8 depicts an elevation view of FIG. 7.

A third embodiment of the invention, a modular dual buffer chamber cluster tool 700 is shown in FIG. 7 and FIG. 8. As such, the reader should refer to FIGS. 7 and 8 simultaneously for the best understanding of the invention.

The tool 700, for example, has first and second modules 702 and 704, respectively, joined by a module mating chamber 706. The first module 702 has a septigonal chamber body 708 featuring sides 710, 712, 714 and 722 having an equal length, sides 716 and 720 having an equal length, and a seventh side 718. Sides 716 and 720 are shorter than the other sides. Side 714 is parallel to side 722 and is bordered by sides 712 and 716. Side 712 is also bordered by side 710. Side 710 is also bordered by side 722. Side 722 is also bordered by side 720. Side 720 is also bordered by side 718.

Load lock chambers 726 and 728 are disposed on sides 710 and 712, respectively. Process chambers 724 and 730 are disposed on sides 722 and 714, respectively. The module mating chamber 706 is disposed on side 718.

A buffer chamber 732 is centrally located within chamber body 708. A plurality (i.e., four) of slit valves 738 selectively isolate the buffer chamber 732 from the process chambers 730 and 724, and the load lock chambers 726 and 728. A slit valve 740 selectively isolates the module mating chamber 706 from buffer chamber 732. The module mating chamber 706 additionally has a pedestal 784. Located within chamber 732 is a first vacuum port 780 and a first robotic wafer transport mechanism 734, e.g., a single blade robot (SBR). Other types of transport mechanisms may be substituted. The first robotic wafer transport mechanism 734 shown has a wafer transport blade 736 attached to the distal ends of a pair of extendible arms 786a and 796o. The blade 736 is used by first robotic wafer transport mechanism 734 for carrying the individual wafers to and from the chambers surrounding chamber 732.

The second module 704 has a chamber body 746 featuring sides 754, 756, 758 and 760 having an equal length, sides 748 and 752 having an equal length, and a seventh side 750. Side 754 is parallel to side 760. Sides 748 and 752 are shorter than the other sides. Side 754 is bordered by sides 752 and 756. Side 752 is also bordered by side 750. Side 750 is also bordered by side 748. Sides 748 is also bordered by 760. Side 760 is also bordered by side 758. Side 758 is also bordered by side 756. Process chambers 762, 764, 766 and 768 are disposed to sides 760, 754, 756 and 758 respectively. The module mating chamber 706 is disposed to side 750.

A buffer chamber 770 is centrally located within chamber body 746. The buffer chamber 770 is circumscribed by the process chambers 762, 764, 766 and 768, and a module mating chamber 706. A plurality (i.e., four) of slit valves 738 isolate the buffer chamber 770 from the process chambers 762, 764, 766 and 768. A slit valve 740 isolates the module mating chamber 706 from buffer chamber 770. Located within buffer chamber 770 is a second vacuum port 782 and a second robotic wafer transport mechanism 772, e.g., a single blade robot (SBR). Other types of transport mechanisms may be substituted. The second robotic wafer transport mechanism 772 shown has a wafer transport blade 774 attached to the distal ends of a pair of extendible arms 738a and 738b. The blade 774 is used by second robotic wafer transport mechanism 772 for carrying the individual wafers to and from the chambers surrounding chamber 770. Both buffer chambers 732 and 770 have an independently operable lid 776 and 778 (see FIG. 8) respectively attached to chamber bodies 708 and 746 that allow access to buffer chambers 732 and 770.

Although the configuration of modules 702 and 704 illustrate the cluster mating chamber 706 secured to a particular side of the modules, this is for example only. The particular side attached to the mating chamber 706, the number of buffer chambers, process chambers per buffer chamber, geometry of the modules and the location of the cluster mating chamber is dependent on a number of parameters unique to each user's needs, including but not limited to the wafer throughput desired, available factory floor space, production line layout and capital constraints. A person skilled in the art may readily use these teaching to obtain varied embodiments while remaining within the spirit of invention.

The vacuum ports 780 and 782 are connected to a pumping mechanism (not shown) such as a turbo molecular pump, which is capable of evacuating the environments of chambers 732 and 770, respectively. The configuration and location of the vacuum ports may vary dependent on design criteria for individual systems, for example the use of a single port in conjunction with a high volume pump.

In operation, the slit valves isolating the buffer chamber 732 from the surrounding chambers remain closed unless wafer transfer requires access to a particular chamber. The slit valves isolating buffer chamber 770 operate similarly. Wafer processing, for example, begins when the buffer chambers 732 and 770 are pumped to a vacuum condition by the pumping mechanism. The first robotic wafer transport mechanism 734 retrieves a wafer from one of the load lock chambers (e.g. 728) and carries that wafer to the first stage of processing, for example, physical vapor deposition (PVD) in process chamber 730. If the chamber is occupied, the first robotic wafer transport mechanism 734 can either wait for the process chamber 730 to become available or move the wafer to a pedestal 784 located within the module mating chamber 706. Once the first robotic wafer transport mechanism 734 no longer is carrying a wafer, first robotic wafer transport mechanism 734 can tend wafers in the other chambers surrounding buffer chamber 732. If process chamber 730 is available, the first robotic wafer transport mechanism 734 deposits the wafer in process chamber 730. Once the wafer is processed and PVD stage deposits material upon the wafer, the wafer can then be moved to a second stage of processing, and so on.

If the required processing chamber is located adjacent to buffer chamber 770, then the wafer must be transported into the module mating chamber 706. The slit valve 740 isolating the buffer chamber 732 and the mating chamber 706 is opened to allow the water to enter the mating chamber 706. The wafer transport blade 736 connected to first robotic wafer transport mechanism 734 is removed from the module mating chamber 706 leaving the wafer on the pedestal 784. After the slit valve 740 separating the buffer chamber 732 and the cluster mating chamber 706 is closed, a second slit valve 740 separating the buffer chamber 770 and the module mating chamber 706 is opened, allowing a wafer transport blade 774 connected to the second robotic wafer transport mechanism 772 to be inserted into the module mating chamber 706 to retrieve the wafer. Once the wafer is inside buffer chamber 770, the second slit valve 740 is closed and the second robotic wafer transport mechanism 772 is free to move the wafer to the desired processing chamber or sequence of chambers serviced by buffer chamber 770 and second robotic wafer transport mechanism 772.

After wafer processing is complete, the wafer is loaded into a cassette (not shown) in a load lock (e.g., 726), moving back through the module mating chamber 706 when necessary.

After a number of complete processing cycles, the buffer chambers 732 and 770 may require service. Maintenance personnel can reach the buffer chambers 732 and 770 at service locations 742 and 744, and gain access to the interior of buffer chambers 732 and 770 by opening or removing the lids 776 and 778.

Non-Isolation of Buffer Environments

Although an important feature of many of the embodiments of the invention is the isolation of the buffer chambers which allow the buffer chambers to run at different environmental conditions, some users may find this feature unnecessary for their particular processing application. Since wafer throughput is also an important feature, some users find it advantageous to run the buffer chambers at identical environmental conditions eliminating the need for slit valves. When configured for non-isolated conditions in the buffer chambers, the robots can directly access the pedestals within the transfer and mating chambers. The direct access increases the speed of wafer transfer and throughput while allowing for a more cost effective and smaller tool.

Figure 9:
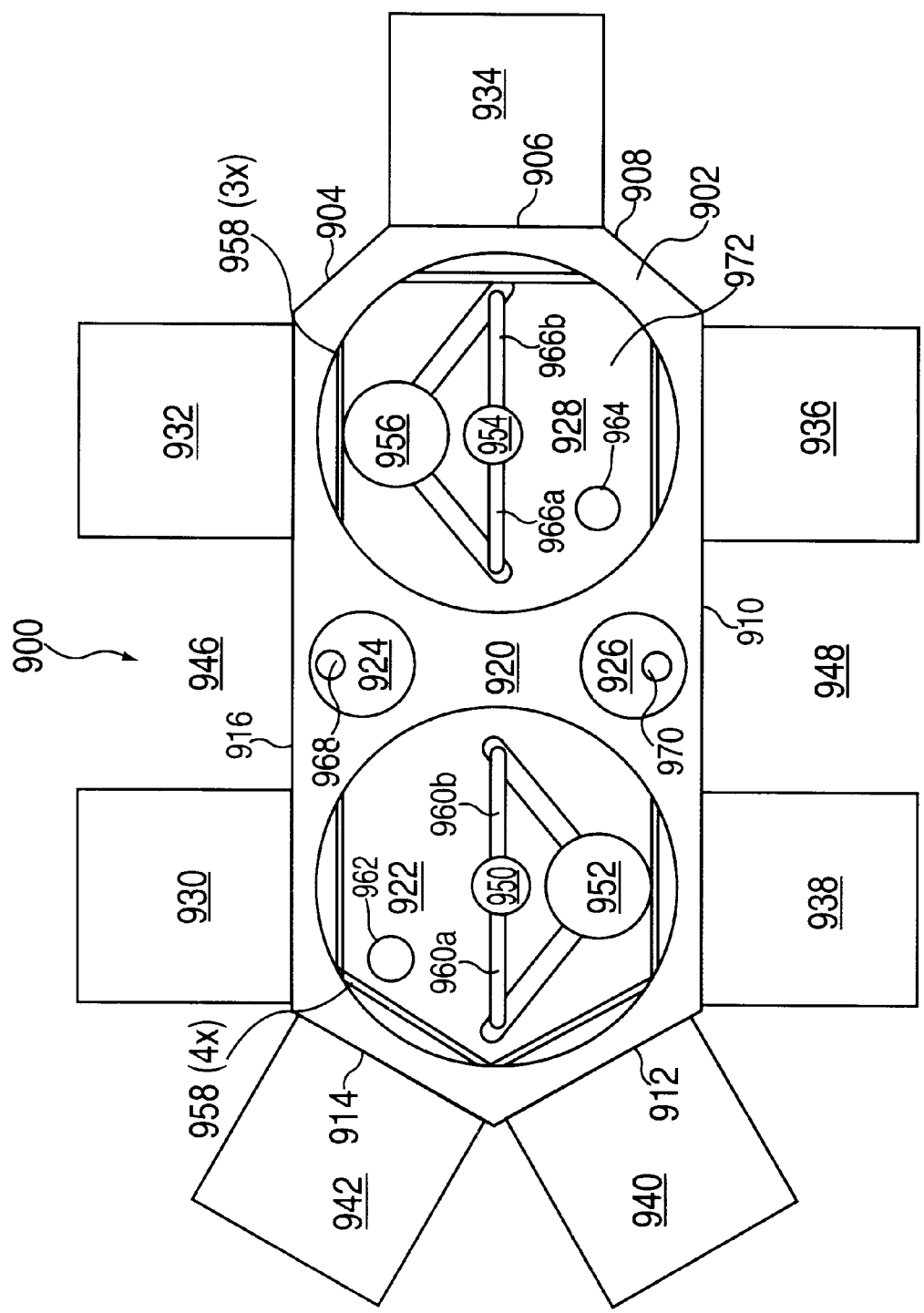
FIG. 9 depicts a simplified schematic diagram of a fourth embodiment of the invention of a non-isolated environment dual buffer chamber.
Figure 10:
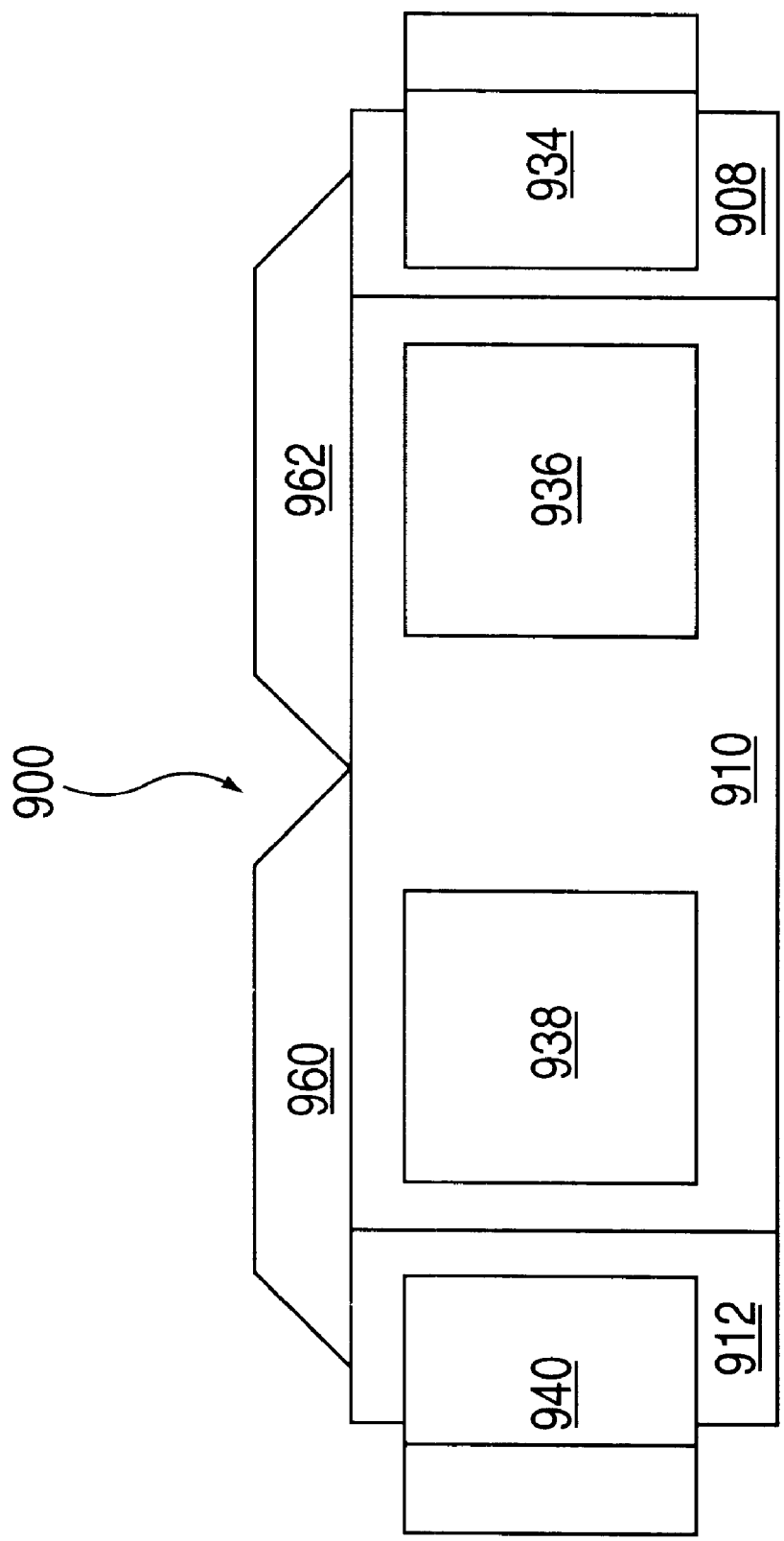
FIG. 10 depicts an elevation view of FIG. 9.

One such embodiment of a non-isolated dual buffer chamber, multiple process chamber cluster tool or nonisolated dual buffer cluster tool is depicted in FIG. 9 and FIG. 10. As such, the reader is encouraged to refer to FIGS. 9 and 10 simultaneously for the best understanding of the invention. Tool 900 has a septigonal chamber body 902 which features a pair of equal length sides 910 and 916, a second pair of equal length sides 912 and 914, a third pair of equal length sides 904 and 908, and a seventh side 906. Side 914 is bounded by 916 on one side and side 912 on the other. Side 916 is also bounded by side 904. Sides 910 and 916 are parallel to each other and are the longer than sides 904, 906 and 912. Side 910 is bounded by sides 908 and 912. Sides 904 and 908 are shorter than side 912, and are separated by side 906. Two load lock chambers 940 and 942 are disposed on sides 912 and 914 respectively. A set of process chambers 930 and 932 are disposed on side 916. A second set of process chambers 936 and 938 are disposed on side 910.

Disposed within the septigonal chamber body 902 are a first and second buffer chamber 922 and 928, respectively, and wafer transfer locations 924 and 926, respectively. The wafer transfer locations may be a chamber. A central wall 920 runs perpendicularly from side 910 to side 916 and separates buffer chambers 922 and 928. Wafer transfer locations 924 and 926 provide a passage through the central wall 920, each chamber 924 and 926 individually connects buffer chambers 922 and 928, creating a single environment 972. Each wafer transfer location 924 and 926 has a pedestal 968 and 970, respectively. Both buffer chambers 922 and 928 have an independent lid 960 and 962 respectively (see FIG. 10). Access areas 946 and 948 are defined by process chambers 930 and 932 along side 916 and by process chamber 936 and 938 along side 910 and provide access to the buffer chambers 922 and 928.

The first buffer chamber 922 is circumscribed by the load lock chambers 940 and 942, process chambers 930 and 938, and wafer transfer locations 924 and 926. The load lock chambers 940 and 942, and process chambers 930 and 938 are selectively isolated from adjoining buffer chamber 922 by a plurality (i.e., four) slit valves 958. Located within buffer chamber 922 is a first vacuum port 962 and a first robotic wafer transport mechanism 950, e.g., a single blade robot (SBR). Other types of transfer mechanisms may be substituted. The first robotic wafer transport mechanism 950 shown has a wafer transport blade 952 attached to the distal ends of a pair of extendible arms 960a and 960b. The blade 952 is used by first robotic wafer transport mechanism 950 for carrying the individual wafers to and from the chambers surrounding buffer chamber 922.

A second buffer chamber 928 is circumscribed by the process chambers 932, 934 and 936, and wafer transfer locations 924 and 926. The process chambers 932, 934 and 936 are selectively isolated from adjoining buffer chamber 928 by a plurality (i.e., four) slit valves 958. Located within second buffer chamber 928 is a second vacuum port 964 and a second robotic wafer transport mechanism 954, e.g., a single blade robot (SBR). The second robotic wafer transport mechanism 954 shown has a wafer transport blade 956 attached to the distal ends of a pair of extendible arms 966a and 966b. The blade 956 is used by second robotic wafer transport mechanism 954 for carrying the individual wafers to and from the chambers surrounding buffer chamber 928.

Although the configuration of the tool 900 is shown having seven sides, it is noted that a six-sided structure may be desired in certain applications where the sides 904, 906 and 908 are replaced with two sides equal in length to side 912. This will allow an additional process chamber to be added to the tool. Many other configurations in addition to the one described above which embody the teachings of the invention will be readily apparent to those skilled in the arts.

The vacuum ports 962 and 964 are connected to a pumping mechanism (not shown) such as a turbo molecular pump, which is capable of evacuating the environments of chambers 922 and 928, respectively. The configuration and location of the vacuum ports may vary dependent on design criteria for individual systems, for example the use of a single port in conjunction with a high volume pump.

In operation, the slit valves 958 isolating the buffer chamber 922 from the surrounding process chambers 930 and 938, and load lock chambers 940 and 942 remain closed unless wafer transfer requires access to those particular chambers. The slit valves 958 isolating buffer chamber 928 operate similarly to isolate process chambers 932, 934 and 936. Wafer processing, for example, begins when the chamber 922 and 928 are pumped to a vacuum condition by the pumping mechanism. The first robotic wafer transport mechanism 950 retrieves a wafer from one of the load lock chambers (e.g., 942) and carries that wafer to the first stage of processing, for example, physical vapor deposition (PVD) in chamber 930. If the chamber is occupied, the first robotic wafer transport mechanism 950 can either wait for the chamber 930 to become available or move the wafer to a pedestal 968 located within wafer transfer location (e.g., 924). Once the first robotic wafer transport mechanism 950 no longer is carrying a wafer, first robotic wafer transport mechanism 950 can tend wafers in the other chambers surrounding buffer chamber 922. If chamber 930 is available, the first robotic wafer transport mechanism 950 deposits the wafer in chamber 930. Once the wafer is processed and PVD stage deposits material upon the wafer, the wafer can then be moved to a second stage of processing, and so on.

If the required processing chamber is located adjacent to buffer chamber 922, then the wafer must be transported into one of the wafer transfer location (e.g., 924). The wafer transport blade 952 connected to first robotic wafer transport mechanism 950 is removed from wafer transport chamber 924 leaving the wafer on the pedestal 968. Wafer transport blade 956 connected to the second robotic wafer transport mechanism 954 to be inserted into wafer transport chamber 924 to retrieve the wafer. Once the wafer is inside buffer chamber 928, the second robotic wafer transport mechanism 954 is free to move the wafer to the desired processing chamber or sequence of chambers serviced by buffer chamber 928 and second robotic wafer transport mechanism 954.

After wafer processing is complete, the wafer is loaded into a cassette (not shown) in a load lock (e.g., 940), moving back through the wafer transfer locations when necessary. Although the example is illustrative of wafer movement towards the right on FIG. 9, wafer processing requirements may require additional wafer transfer between buffer chambers during the course of wafer processing.

After a number of complete processing cycles, the chambers 922 and 928 may require service. Maintenance personnel can reach the chambers 922 and 928 at access areas 946 and 948, and gain access to the interior of chambers 922 and 928 by opening or removing the lids 960 and 962

As demonstrated by these steps, the present invention saves significant time by facilitating wafer transport between robotic wafer transport mechanisms without having to wait for the opening and closing of slit valves and environmental changes to occur within a transfer chamber. Additionally, the elimination of the slit valves allows the non-isolated tool 900 disclosed in FIG. 9 to enjoy the cost savings associated with fewer components and simpler operation as compared to prior art processing tools.

Squeezed Non-Isolated Dual Buffer Chamber

Figure 11:
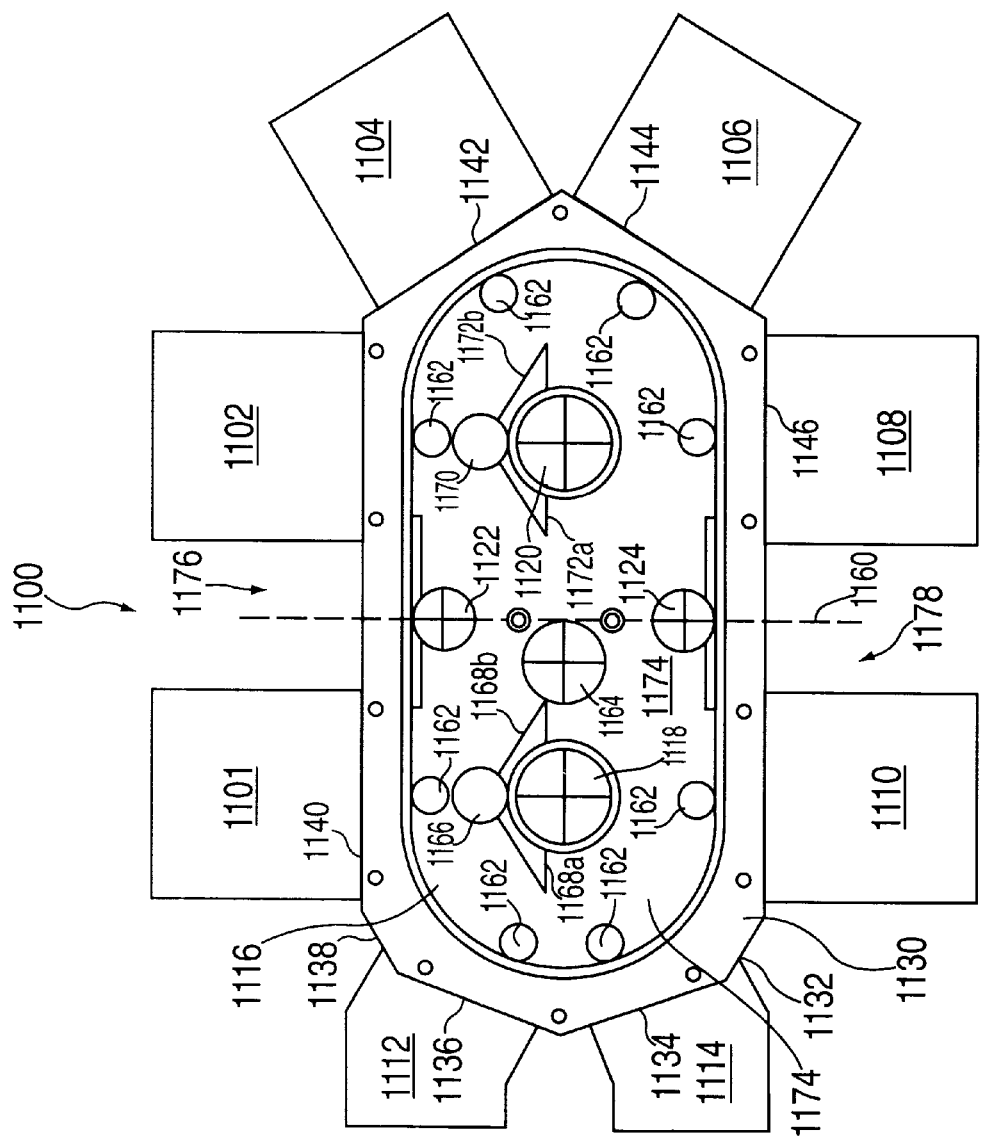
FIG. 11 depicts a simplified schematic diagram of a fifth embodiment of the invention of a "squeezed" dual buffer chamber.
Figure 12:
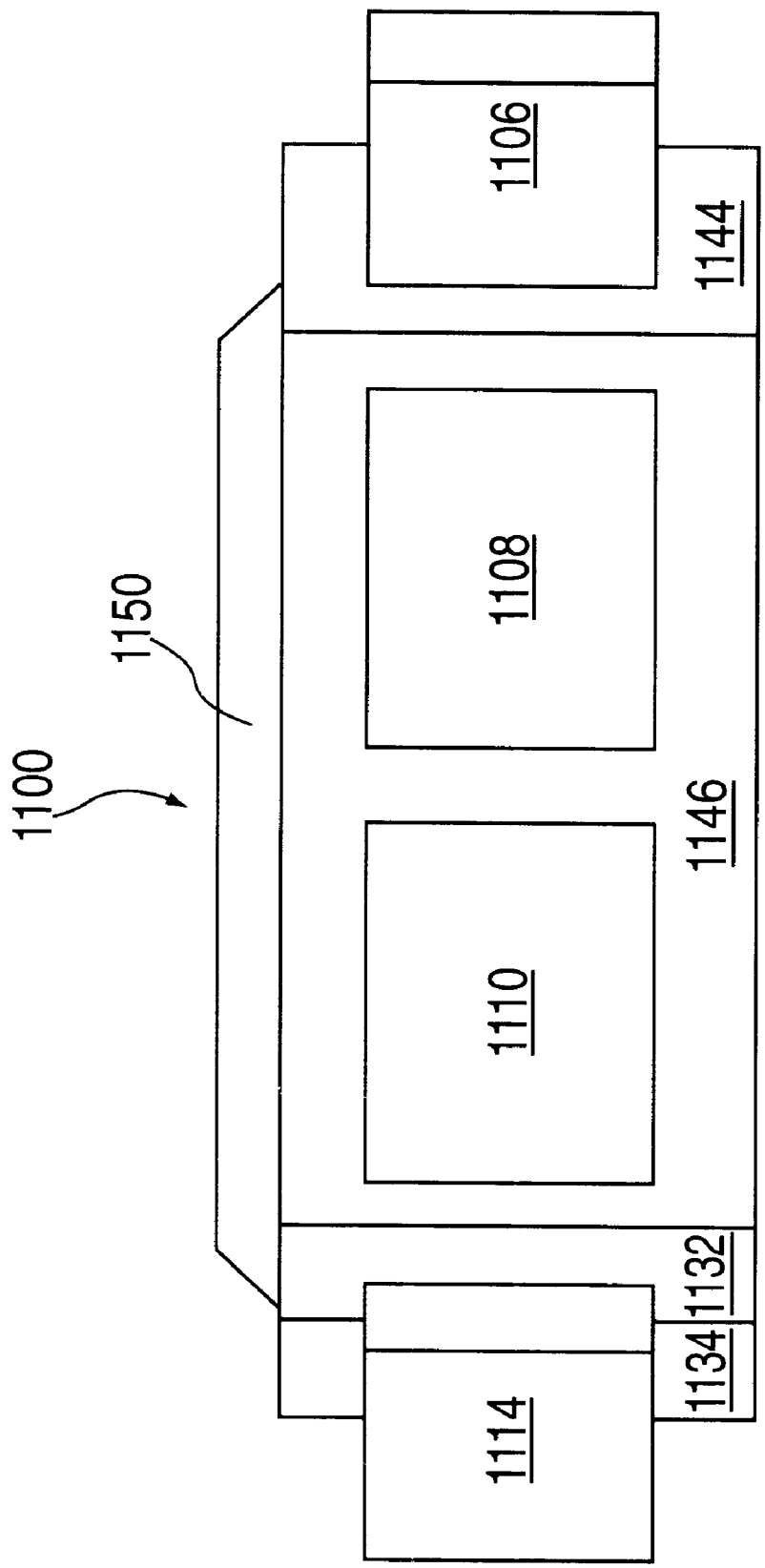
FIG. 12 depicts an elevation view of FIG. 11.

An embodiment which maximizes the ability to reduce further the foot-print and costs savings of the non-isolated dual buffer chamber cluster tool is a "squeezed" nonisolated dual buffer chamber, multiple process chamber semiconductor processing tool or "squeezed" dual buffer chamber cluster tool. The "squeezed" tool is depicted in FIGS. 11 and 12. As such, the reader should refer to FIGS. 11 and 12 simultaneously for the best understanding of the invention. The "squeezed" tool 1100 referring primarily to FIG. 11 has octagonal chamber body 1130 which features sides 1140 and 1146 having an equal length, sides 1142 and 1144 having an equal length shorter than side 1140, sides 1134 and 1136 having an equal length shorter than side 1142, and sides 1132 and 1138 having an equal length shorter than side 1134. Sides 1140 and 1146 are parallel to each.

Side 1140 is bounded by 1136 and side 1142. Side 1142 is also bounded by side 1144. Side 1144 is also bounded by 1146. Side 1146 is also bounded by side 1132. Side 1132 is also bounded by 1134. Side 1134 is also bounded by side 1136.

Disposed within the octagonal chamber body 1130 is a buffer chamber 1116. The environment 1172 of buffer chamber 1116 is selectively isolated from adjoining load locks and process chambers by a plurality (i.e., eight) of slit valves 1162. Buffer chamber 1116 additionally has a singular lid 1150 (see FIG. 12). Disposed within the buffer chamber 1116 are a first robotic wafer transport mechanism 1118, a second robotic wafer transport mechanism 1120, a vacuum port 1164, and a first and second pedestal 1122 and 1124, respectively. The vacuum port connects the buffer chamber 1116 to a pumping mechanism (not shown) such as a turbo molecular pump.

The first robotic wafer transport mechanism 1118 is for example, a single blade robot (SBR). Other types of transport mechanism may be substituted. The first robotic wafer transport mechanism 1118 shown has a wafer transport blade 1166 attached to the distal ends of a pair of extendible arms, 1168a and 1168b. The pedestals 1122 and 1124 are located along an imaginary axis 1160 which bisects sides 1140 and 1146. Two load lock chambers 1112 and 1114 are attached to sides 1136 and 1134, respectively. A set of process chambers 1101 and 1102 are disposed on side 1140 and define an access area 1176. A second set of process chambers 1108 and 1110 are disposed on side 1146 and define an access area 1178. Access area 1176 and 1178 may be eliminated if a minimized foot-print is desired. Process chambers 1104 and 1106 are disposed on sides 1142 and 1144, respectively. The first robotic wafer transport mechanism 1118 is substantially centrally located to the load lock chambers 1112 and 1114, process chambers 1101 and 1110 and the pedestals 1122 and 1124. First robotic wafer transport mechanism 1118 is additionally equidistant from pedestals 1122 and 1124. The blade 1166 is used by first robotic wafer transport mechanism 1118 to facilitate transfer of wafers among the load lock chambers 1112 and 1114, process chambers 1101 and 1110, and the pedestals 1122 and 1124.

The second robotic wafer transport mechanism 1120 is for example, a single blade robot (SBR). Other types of transport mechanism may be substituted. The second robotic wafer transport mechanism 1120 shown has a wafer transport blade 1170 attached to the distal ends of a pair of extendible arms, 1172a and 1172b. The second robotic wafer transport mechanism 1120 is substantially centrally located to the process chambers 1102, 1104, 1106 and 1108 and the pedestals 1122 and 1124. Second robotic wafer transport mechanism 1120 is additionally equidistant from pedestals 1122 and 1124. The blade 1166 is used by second robotic wafer transport mechanism 1120 to facilitate transfer of wafers among process chambers 1102, 1104, 1106 and 1108, and the pedestals 1122 and 1124.

Although the configuration of the tool 1100 is shown having eight sides, it is noted that other polygonal structures may be employed while remaining within the spirit and teachings of the invention.

The vacuum port 1164 is connected to a pumping mechanism (not shown) such as a turbo molecular pump, which is capable of evacuating the environment of buffer chamber 1116. The configuration and location of the vacuum ports may vary dependent on design criteria for individual systems, for example the use of a single port in conjunction with a high volume pump.

In operation, the slit valves isolating the buffer chamber 1116 from the surrounding process chambers (1101, 1102, 1104, 1106, 1108, 1110) and load lock chambers (1112, 1114) chambers remain closed unless wafer transfer requires access to those particular chambers. Wafer processing, for example, begins when the buffer chamber 1116 is pumped down to a vacuum condition by the pumping mechanism. The first robotic wafer transfer mechanism 1118 retrieves a wafer from one of the load lock chambers (e.g. 1112) and carries that wafer to the first stage of processing, for example, physical vapor deposition (PVD) in chamber 1101. If the chamber is occupied, the first robotic transfer mechanism 1118 can either wait for the chamber 1101 to become available or move the wafer to a pedestal 1122. Once the first robotic transfer mechanism 1118 is no longer carrying a wafer, first robotic transfer mechanism 1118 can tend wafers in the other chambers and platforms serviced by first robotic transfer mechanism 1118. If chamber 1101 is available, the first robotic transfer mechanism 1118 deposits the wafer in chamber 1101. Once the wafer is processed and PVD stage deposits material upon the wafer, the wafer can then be moved to a second stage of processing, and so on.

If the required processing chamber is serviced by the second robotic transfer mechanism 1120, then the wafer must be transported into one of the pedestals (e.g. 1122). The first robotic transfer mechanism 1118 leaves the wafer on the pedestal 1122. Second robotic transfer mechanism 1120 retrieves the wafer from pedestal 1122 and delivers the wafer to the desired processing chamber or sequence of chambers serviced by second robotic transfer mechanism 1120.

After wafer processing is complete, the wafer is loaded into a cassette (not shown) in a load lock (e.g., 1114), moving back across the pedestals when necessary. Although the example is illustrative of wafer movement towards the right on FIG. 11, wafer processing requirements may require additional wafer transfer across the pedestals during the course of wafer processing.

As demonstrated by these steps, the present invention saves significant time by facilitating wafer transport between robotic mechanisms without having to wait for the opening and closing of slit valves and environmental changes to occur when using a transfer chamber. Additionally, the elimination of the transfer chambers and the use of a singular lid 1150 allow the "squeezed" tool 1100 disclosed in FIG. 11 to enjoy a reduced foot-print and the cost savings associated with fewer components and simpler operation as compared to the other embodiments.

Although various embodiments which incorporate the teachings of the present invention have been shown and described herein, those skilled in the art can readily devise many other varied embodiments that still incorporate these teachings.

What is claimed is:

1. A semiconductor workpiece processing apparatus comprising:
   at least one polygonal structure having a lid and a plurality of sides; and
   at least one of said sides having at least two process chambers disposed thereupon, defining an access area to said polygonal structure between said process chambers.

2. The apparatus of claim 1 further comprising:
   a first buffer chamber disposed in said at least one polygonal structure, and
   a second buffer chamber disposed in said at least one polygonal structure.

3. The apparatus of claim 2 further comprising:
   at least one wafer transfer location disposed within said polygonal structure.

4. The apparatus of claim 3 wherein said wafer transfer location is a chamber.

5. The apparatus of claim 2 wherein said first and second buffer chambers further comprise:
   a first and a second lid disposed above said first and second buffer chambers, respectively, thereby defining a single environment within said first and second buffer chambers.

6. The apparatus of claim 2 wherein said first and second buffer chambers further comprise:
   a plurality of slit valves disposed about and selectively isolating said first and second buffer chamber, and
   a first and a second lid disposed above said first and second buffer chambers, respectively, thereby defining a first and second environment within said first and second buffer chambers, respectively.

7. A semiconductor workpiece processing apparatus comprising:
   at least one polygonal structure having a plurality of sides;
   a buffer chamber disposed within said at least one polygonal structure;
   a lid disposed above said at least one polygonal structure thereby defining a single environment within said buffer chamber;
   at least two wafer transfer mechanisms disposed within said buffer chamber; and
   a first and a second process chamber disposed on one of said sides defining an access area between said first and said second process chambers and said one side.

8. The apparatus of claim 7 further comprising:
   at least six slit valves disposed within said buffer chamber.

9. The apparatus of claim 7 further comprising a single vacuum port.

* * * * *